(12) United States Patent
Morimoto

(10) Patent No.: US 6,514,377 B1
(45) Date of Patent: Feb. 4, 2003

(54) APPARATUS FOR AND METHOD OF PROCESSING AN OBJECT TO BE PROCESSED

(75) Inventor: Tamotsu Morimoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 170 days.

(21) Appl. No.: 09/657,054

(22) Filed: Sep. 7, 2000

(30) Foreign Application Priority Data

Sep. 8, 1999 (JP) ............................................ 11-253734

(51) Int. Cl.[7] ........................... H05H 1/00; H01L 21/00
(52) U.S. Cl. ............................. 156/345.46; 118/723 E; 204/298.37
(58) Field of Search ........................ 156/345.43, 345.44, 156/345.46, 345.47; 118/723 E, 723 R; 204/298.37

(56) References Cited

U.S. PATENT DOCUMENTS 4,950,956 A * 8/1990 Asamaki et al. .......... 118/723 E
5,880,034 A * 3/1999 Keller .................... 156/345.42
6,245,190 B1 * 6/2001 Masuda et al. ...... 118/723 MA

FOREIGN PATENT DOCUMENTS

JP          5-308055         11/1993

* cited by examiner

Primary Examiner—Thi Dang
(74) Attorney, Agent, or Firm—Finnegan Henderson Farabow Garrett & Dunner, L.L.P.

(57) ABSTRACT

A magnetron reactive ion etching apparatus comprises: an electrode unit including electrodes facing each other through a semiconductor device; a high-frequency power source forming an electric field on the electrode unit; a dipole ring magnet; and a switching mechanism. The dipole ring magnet forms the first magnetic field state, including a magnetic field in a direction perpendicular to a direction of the electric field or in a direction parallel to the semiconductor device, and the second magnetic field state, including a magnetic field whose strength at the periphery of the surface of the semiconductor device is so satisfactory that an electron Larmor radius is larger than the mean free path of electrons. The first magnetic field state is switched to the second magnetic field state at a predetermined timing by the switching mechanism which is controlled by a controller.

10 Claims, 14 Drawing Sheets

DIPOLE

MULTI-POLE

APPARATUS FOR AND METHOD OF PROCESSING AN OBJECT TO BE PROCESSED

BACKGROUND OF THE INVENTION

1. Field of the Invention

The present invention relates to an apparatus for and a method of processing an object to be processed, and, more particularly, to an apparatus for and a method of processing an object to be processed while restricting shading damages.

2. Description of the Related Art

Of reactive ion etching apparatuses, there is included a magnetron reactive ion etching apparatus, which efficiently performs etching processing with a magnetic field generated from a magnetron.

Etching processing using a magnetron reactive ion etching apparatus is performed as follows: First, high-frequency electric power is supplied to a pair of electrodes arranged inside a processing container of the magnetron reactive ion etching apparatus so as to form an electric field. Next, electrons are discharged from an etching gas, thereby to form a plasma at the periphery of the surface of an object to be processed, such as a semiconductor wafer or the like, arranged on the electrodes. Then, a magnetic field is formed in a horizontal direction with respect to the semiconductor wafer using magnetic field formation means, for example, a permanent magnet or the like. In doing this, the electrons are caused to be in cyclotron motion (spiral motion), whereby the frequency at which the electrons and neutral particles collide with each other is high. Under this structure where the electrons and the neutral particles collide with each other, a reactive gas is efficiently ionized at the periphery of the surface of the semiconductor wafer. The ions are injected into the processing surface of the semiconductor wafer, thus etching is efficiently performed as a result of both a sputtering effect and a chemical reaction of ions.

In thus structured magnetron reactive ion etching apparatus, it is important that a magnetic field is uniformly formed in a horizontal direction with respect to the semiconductor wafer. This is because if a magnetic field is not formed uniformly in the horizontal direction, the surface of the semiconductor wafer is etched at a variety of etching speeds. FIG. 10 illustrates a dipole ring magnet as magnetic field formation means used in the magnetron reactive ion etching apparatus.

As illustrated in FIG. 10, a dipole ring magnet 101 comprises a dipole ring body 102 formed in a ring-like shape and a plurality of anisotropic segment cylindrical magnets 103 arranged in the dipole ring body 102 at equal intervals. The anisotropic segment cylindrical magnets 103 are arranged in such a way that their magnetization directions are slightly differently oriented from one another, so as to form a magnetic field totally in one direction.

The dipole ring magnet 101 is arranged outside a processing container 104, and a magnetic field B is formed in a horizontal direction with respect to a semiconductor wafer 105.

The dipole ring magnet 101 can rotate along its circumferential direction. In rotating this dipole ring magnet 101, a rotational magnetic field is formed uniformly in a horizontal direction with respect to the semiconductor wafer 105, and the density of a plasma on the semiconductor wafer 105 can uniformly be made.

The magnetic field strength is large in magnetron reactive ion etching, thus a problem is that shading damage is likely to occur in an over-etching process, for example. For the sake of easy description of shading damage, FIG. 11 illustrates an exemplary diagram of a transistor in an overetching process.

As illustrated in FIG. 11, a transistor 111 is a MOS type transistor wherein a gate oxide film 113 and a gate electrode 114 are formed on a semiconductor wafer 112. The first interlayer insulating film 115 is formed on a corresponding part of the semiconductor wafer 112 on which the gate oxide film 113 and the gate electrode 114 are not formed. Metal wiring 116 is formed on the first interlayer insulating film 115 and the gate electrode 114. The second interlayer insulating film 117 is formed on the metal wiring 116, and a resist 118 is arranged on the second interlayer insulating film 117. By performing a magnetron reactive ion etching process, some part of the second interlayer insulating film 117 which is not masked by the resist 118 is etched, resulting in forming a hole 119.

During the magnetron reactive ion etching process, electrons are attracted (being in cyclotron motion) to a magnetic field. The speed (the speed of the electrons travelling in a top-down direction, as illustrated in FIG. 11) at which the electrons move toward the hole 119 is low, thus the electrons are hardly to enter the hole 119. As compared to the electrons, positive charge ions are unlikely to be attracted to the magnetic field for some reasons that their mass is great and the like. Hence, the speed at which positive ions move toward the hole 119 is higher than the speed of electrons travelling to the hole 119, and the positive ions are likely to enter the hole 119. As shown in FIG. 11, electrons 121 are likely to be charged up on the resist 118 during the overetching process, while positive ions 120 are likely to be charged up on the bottom of the hole 119. As a result of this, a potential difference occurs in the upper and lower surfaces of the gate insulating film 113. In addition, a current flows through the gate insulating film 113 in a direction shown with an arrow 122 in the drawing, resulting in shading damage in which the gate insulating film 113 is deteriorated.

As a method for preventing such an insulating film from being deteriorated, proposed in Unexamined Japanese Patent Application KOKAI Publication No. H5-308055 is a method for forming gate electrode wiring without deterioration of a gate oxide film. This formation of the gate electrode wiring is achieved by performing magnetic field high-density plasma etching when patterning metal wiring connected to a gate electrode, and performing non-magnetic field low-density plasma etching and patterning the metal wiring before the metal wiring is completely isolated therefrom.

According to this invention, it is possible that an insulating film is prevented from being deteriorated as a result of shading damage, etc., since changing from the magnetic field high-density plasma etching to the non-magnetic field low-density plasma etching can prevent electrons from being attracted to the magnetic field.

However, the etching speed dramatically decreases if the magnetic field high-density plasma etching is changed to the non-magnetic field low-density plasma etching. Therefore, if the magnetic field high-density plasma etching is not performed until just before the etching process is completed, the essential purpose of the magnetron reactive ion etching for efficiently performing an etching process is not realized.

On the contrary, if the magnetic field high-density plasma etching is performed until just before the etching process is completed, the gate oxide film is exposed from a part of a hole, which is made as a result of the etching. In the structure where the gate oxide film is thus exposed, the electrons are distributed not uniformly on the semiconductor wafer, bringing another problem that charge up damage occurs.

SUMMARY OF THE INVENTION

The present invention has been made in consideration of the above problems. It is accordingly an object of the present invention to provide an apparatus for and a method of efficiently processing an object to be processed while restricting shading damages.

In order to accomplish the above object, according to the first aspect of the present invention, there is provided a processing apparatus, comprising:

a processing container;

an electrode unit which is arranged inside said processing container and includes a first electrode and a second electrode facing each other via an object to be processed;

a processing gas supply section which supplies a processing gas into said processing container;

a gas exhaust section which exhausts said processing container of a gas;

an electric field formation section which supplies high-frequency electric power to said electrode unit and forms an electric field between the first electrode and the second electrode;

a magnetic field formation section which forms a first magnetic field state, including a magnetic field in said electrode unit in a direction perpendicular to the direction of the electric field or in a direction parallel to the object, and a second magnetic field state, including a magnetic field whose magnetic field strength at a periphery of a surface of the object is so satisfactory that an electron Larmor radius is larger than a mean free path of electrons in the magnetic field; and a magnetic field state switching section which switches a magnetic field state from/to the first magnetic field state to/from the second magnetic field state.

In this structure, the first magnetic field state is formed and an efficient etching process, for example, is performed. In the case where shading damage is likely to occur, the second magnetic field state is switched from the first magnetic field state by the magnetic field state switching means so as to perform, for example, an etching process. In the second magnetic field state, there exists a magnetic field wherein an electron Larmor radius is larger than the mean free path of electrons, thus the processing speed does not dramatically decrease. Because the electron Larmor radius is larger than the mean free path of electrons and there is a high percentage of electrons which pass by the magnetic field and are diffused, the electrons are more likely to enter the bottom of a hole on the processing surface. This achieves restriction of shading damages in an object to be processed.

The second magnetic field includes a magnetic field in a direction perpendicular to the direction of the electric field or in a direction parallel to the object. In this structure, the processing speed is unlikely to decrease, thus achieving an efficient etching process, for example.

The processing gas includes a gas having reactive ion species and used for performing magnetron reactive ion processing for the object. In this structure, an etching process is efficiently performed as a result of both a sputtering effect and a chemical reaction of ions.

The magnetic field state switching section includes a switch control mechanism which switches the first magnetic field state to the second magnetic field state at a predetermined timing. This achieves automatic switching of the magnetic field states.

A magnetic field is uniformly formed on the object in the first magnetic field state and in the second magnetic field state. In this structure, a rotational magnetic field is uniformly formed in a horizontal direction with respect to the object to the processed, and the density of a plasma is even at the object.

The magnetic field formation section includes a plurality of electromagnets which are so arranged that said electrode unit is sandwiched therebetween, and said magnetic field state switching section is capable of switching a flow amount of current flowing to the electromagnets from/to a first flow amount to/from a second flow amount; and the first flow amount of current flows to the electromagnets so as to form the first magnetic field state, and the second flow amount of current flows to the electromagnets so as to form the second magnetic field state. in this structure, the flow amount of current is switched from the first flow amount to the second flow amount, thereby the magnetic field state is switched from the first magnetic field state to the second magnetic field state.

The magnetic field formation section includes a plurality of permanent magnets which are so arranged that the electrode unit is sandwiched therebetween, and said magnetic field state switching section forms the first magnetic field state by arranging the plurality of permanent magnets in dipole arrangement and also the second magnetic field state by changing directions of magnetic poles of the plurality of permanent magnets. In this structure, a large magnetic field can be formed in the first magnetic field state, achieving an efficient etching process, for example.

According to the second aspect of the present invention, there is provided a method of processing an object to be processed, comprising:

an arranging step of arranging the object between a pair of electrodes forming an electrode unit arranged inside a processing container;

a decompressing step of decompressing the processing container at a predetermined pressure level;

a processing gas supplying step of supplying processing gas into the processing container, an electric field formation step of supplying high-frequency electric power to the electrode unit and forming an electric field between the pair of electrodes;

a magnetic field formation step of forming in the electrode unit a first magnetic field state in a direction perpendicular to a direction of the electric field or in a direction parallel to the object; and a magnetic field state switching process of switching a magnetic field state from the first magnetic field state to a second magnetic field state, whose magnetic field strength at a periphery of a surface of the object is so satisfactory that an electron Larmor radius in the second magnetic field state is larger than a mean free path of electrons.

In this structure, the first magnetic field state is formed and an efficient etching process, for example, is performed. In the case where the shading damage is likely to occur, the second magnetic field is switched from the first magnetic field state in the magnetic field state switching process, and the etching process is performed. In this second magnetic field stated, there exists a magnetic field wherein the electron Larmor radius is larger than the mean free path of electrons, thus the processing speed does not dramatically decrease. Because the electron Larmor radius is larger than the mean free path of electrons and there is a high percentage of electrons which pass by the magnetic field and are diffused, the electrons are more likely to enter the bottom of a hole on the processing surface. This achieves restriction of shading damages in an object to be processed.

The second magnetic field state having a magnetic field in the direction perpendicular to the direction of the electric field or in the direction parallel to the object is formed. In this structure, the processing speed is unlikely to decrease, thus achieving an efficient etching process, for example.

The processing gas includes a gas having reactive ion species and used for performing magnetron reactive ion processing for the object. In this structure, an etching process is efficiently performed as a result of both a sputtering effect a chemical reaction of ions.

In the magnetic field state switching process, the first magnetic field state is switched to the second magnetic field state at a predetermined timing. This achieves automatic switching of the magnetic field states.

A magnetic field is uniformly formed on the object in the first magnetic field state and the second magnetic field state. In this structure, a rotational magnetic field is uniformly formed in a horizontal direction with respect to the object to the processed, and the density of a plasma is even at the object.

BRIEF DESCRIPTION OF THE DRAWINGS

The object and other objects and advantages of the present invention will become more apparent upon reading of the following detailed description and the accompanying drawings in which.

DETAILED DESCRIPTION OF THE PREFERRED EMBODIMENTS

Figure 1:
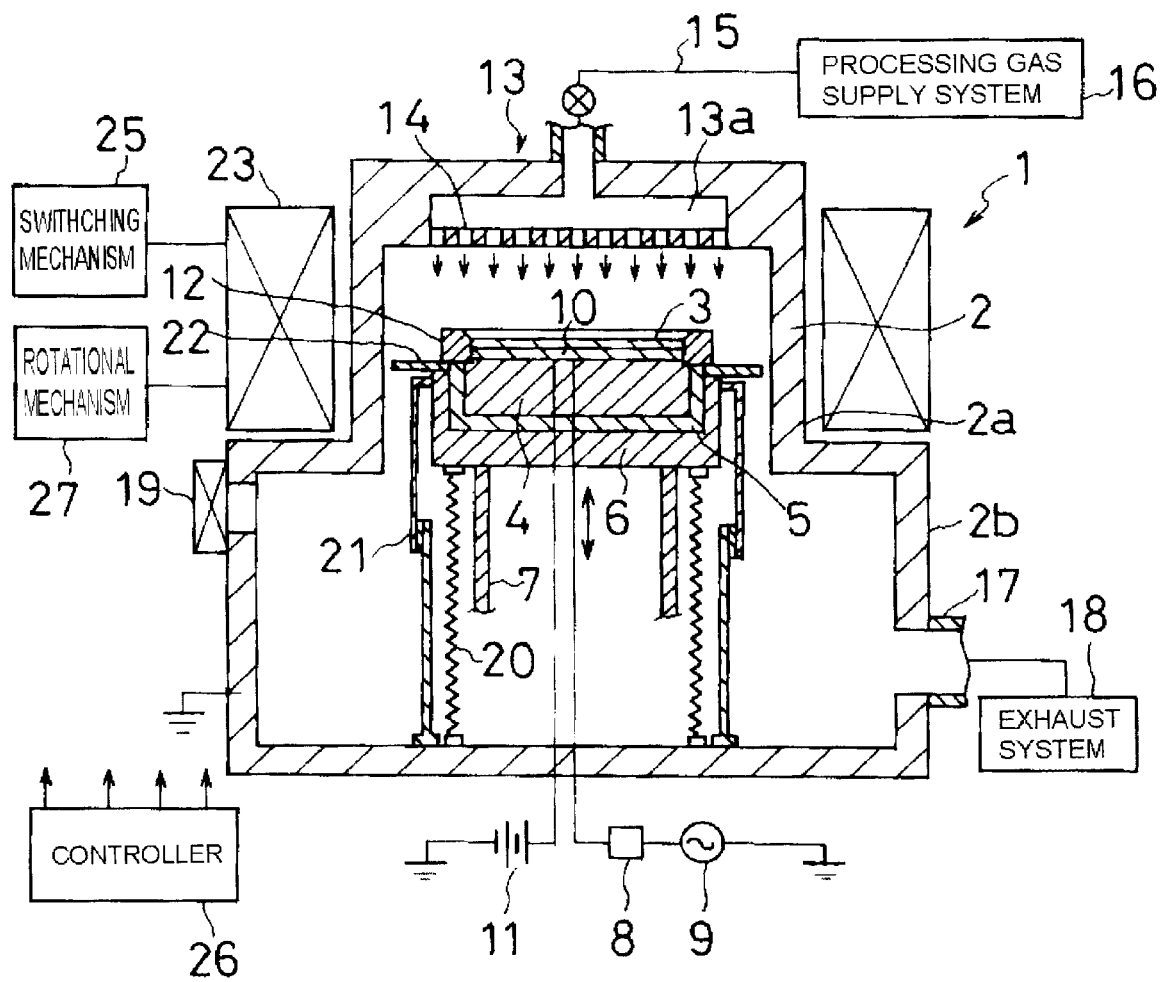
FIG. 1 is a cross sectional view of a magnetron reactive ion etching apparatus according to one embodiment of the present invention.

One embodiment of the present invention will now be described with reference to FIGS. 1 to 4. FIG. 1 illustrates a cross sectional view of a magnetron reactive ion etching apparatus according to the embodiment of the present invention.

As shown in FIG. 1, a magnetron reactive ion etching apparatus 1 comprises a processing container 2 for performing etching processing, and a dipole ring magnet 23 for forming a magnetic field in the processing container 2.

The processing container 2 is composed of two cylinders of different diameters. The two cylinders include an upper part 2a, having a small diameter, for performing etching processing for a semiconductor device 3, and a lower part 2b, having a large diameter, for transporting the semiconductor device 3 into or from the processing container 2. This processing container 2 is formed of metal, for example, aluminum or the like.

A setting stand 4 for supporting the semiconductor device 3 is arranged inside the processing container 2. The setting stand 4 is formed of metal, for example, aluminum or the like, and has a function as the first electrode. This setting stand 4 is supported by a supporting table 6, which is a conductor, via an insulating plate 5. This supporting table 6 is movable upward and downward by a ball screw mechanism including a ball screw 7, and is moved upward and downward so that the setting stand 4 (the semiconductor device 3) is arranged at a predetermined height.

The setting stand 4 is connected to a high-frequency power source 9 via a blocking capacitor 8. The high-frequency power source 9 supplies the setting stand 4 with high-frequency electric power at a frequency of, for example, 13.56 MHz. By the function of the blocking capacitor 8, the setting stand 4 is self-biased toward negative potentials.

An electrostatic chuck 10 for performing electrostatic absorption for the semiconductor device 3 is arranged on the upper surface of the setting stand 4. The electrostatic chuck 10 is formed in the structure where an electrode intervenes between insulators and connected to a direct-current power source 11. A voltage is applied to the electrode from the direct-current power source 11, thereby the semiconductor device 3 (semiconductor wafer) is adhered to the electrostatic chuck 10 and arranged on the setting stand 4 according to Coulomb's law.

A focus ring 12 for focusing the density of a plasma on the processing surface of the semiconductor device 3 is arranged on the outer circumference on the top surface of the setting stand 4 (at the periphery of the semiconductor device 3 in the state where the semiconductor device 3 is arranged on the setting stand 4). The focus ring 12 is formed of a conductive material, for example, single crystal silicon or the like.

A non-illustrative coolant path is arranged inside the setting stand 4. Coolant at a predetermined temperature is circulated through the coolant path, thereby the semiconductor device 3 can be controlled at a predetermined temperature.

A shower head 13 facing the setting stand 4 is included in the upper part 2a of the processing container 2. This shower head 13 has a function as the second electrode. The shower head 13 and the setting stand 4 form an electrode unit as a pair of electrodes.

The shower head 13 has the hollow structure with a hollow 13a formed therein. A plurality of gas exhaust holes 14 for connecting between the hollow 13a and the processing container 2 are arranged on the lower section of the shower head 13. A gas supply tube 15 for supplying an etching gas into the hollow 13a (the processing container 2) is connected to the upper section of the shower head 13. This gas supply tube 15 is connected to a processing gas supply system 16 for supplying a reaction gas, for example, a gas having halogen-based reactive ion species, and a dilution gas, for example, Ar, He, etc. The etching gas supplied from the processing gas supply system 16 is uniformly sent onto the processing surface of the semiconductor device 3 via the gas supply tube 15, the hollow 13a of the shower head 13 and the plurality of gas exhaust holes 14.

An exhaust hole 17 is formed on the lower side wall of the lower part 2b of the processing container 2, and is connected to an exhaust system 18. The exhaust system 18 includes a vacuum pump and the like. The pressure inside the processing container 2 is decompressed at a predetermined pressure level (a degree of vacuum) by activating the vacuum pump.

A gate valve 19 for opening/closing a gate for letting the semiconductor device 3 in and out is arranged on the upper side wall of the lower part 2b of the processing container 2.

The lower end of the supporting table 6 is hermetically connected to one end of bellows 20 which is elastic. The other end of the bellows 20 is hermetically connected to the bottom surface of the processing container 2. This bellows 20 is formed of stainless steel (SUS). A bellows cover 21 covers the outer section of the bellows 20.

A baffle plate 22 is arranged outside the focus ring 12. This baffle plate 22 includes a plurality of holes for controlling the processing gas to flow in the direction to the lower part 2b of the processing container 2. This baffle plate 22 continues to the processing container 2 through the supporting table 6 and the bellows 20.

Figure 2:
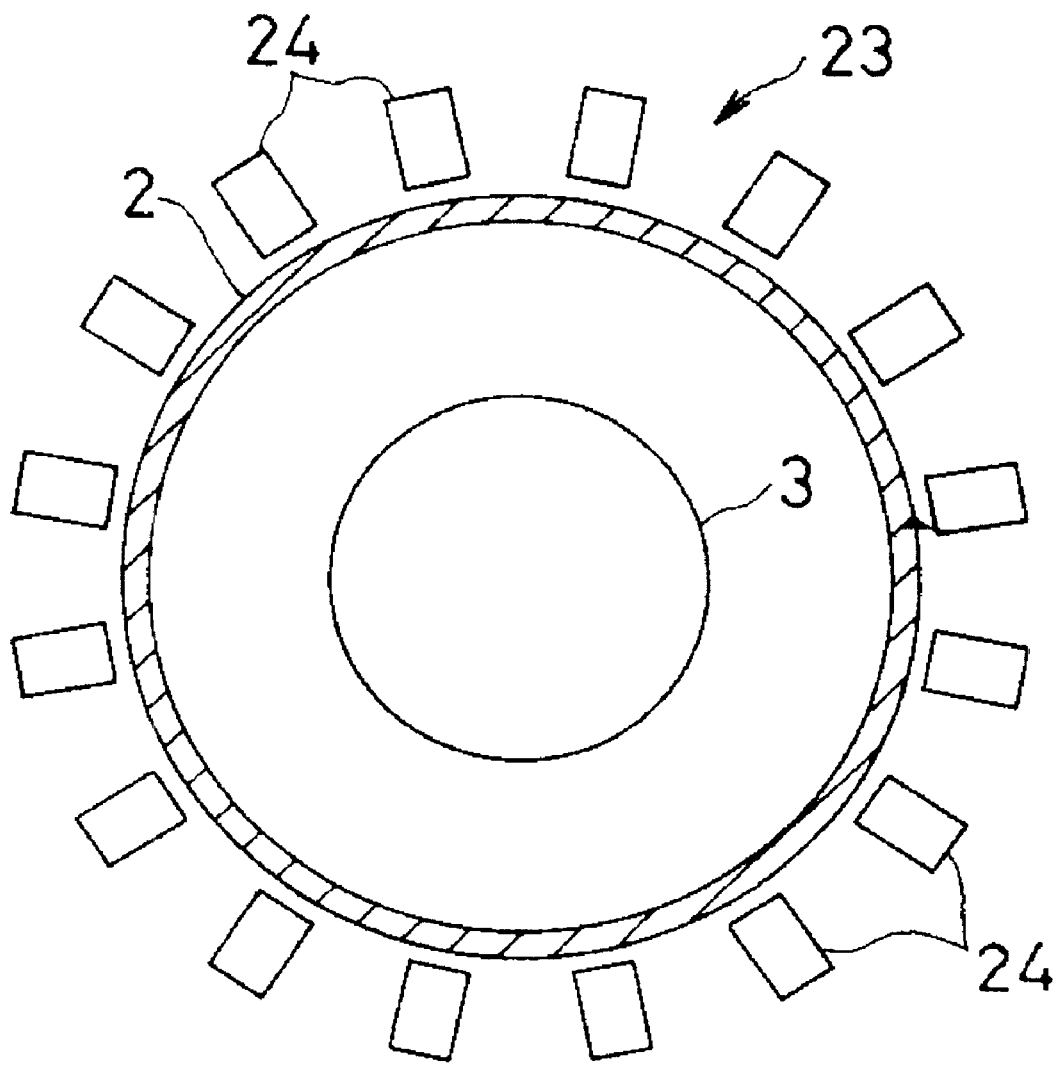
FIG. 2 is a cross sectional view showing a dipole ring magnet according to the embodiment.

The dipole ring magnet 23 is arranged on the outer circumference of the upper part 2a of the processing container 2 so that a space (hereinafter referred to as a processing space) between the setting stand 4 and the shower head 13 is sandwiched therebetween. FIG. 2 is a horizontal sectional view of the dipole ring magnet 23.

As shown in FIG. 2, the dipole ring magnet 23 includes a plurality of segment magnets 24. The segment magnets 24 are arranged in a ring-like form while being supported by a non-illustrative supporting member. In this embodiment, 16 segment magnets 24 are formed in a ring-like form, and each of them includes an electromagnet comprising an iron core and a coil.

The dipole ring magnet 23 is connected to a switching mechanism 25 controlling a current to flow to each of the segment magnets 24 so as to form a magnetic field. The switching mechanism 25 switches two levels of flow amounts of a current, flowing to each of the segment magnets 24, from one to another. The two levels of flow amounts include the first flow amount and the second flow amount which is less than the first flow amount. When the first flow amount of current flows to each of the segment magnets 24, the processing space is in the first magnetic field state wherein a magnetic field is formed totally in one direction. When the second flow amount of current flows to each of the segment magnets 24, the processing space is in the second magnetic field state wherein the strength of the magnetic field is lower than that in the first magnetic field state. In addition, in the second magnetic field, the strength of the magnetic field around the surface of the semiconductor device 3 is so satisfactory that the electron Larmor radius is larger than the mean free path of electrons.

The timing at which the switching mechanism 25 switches the flow amount of current flowing to the coil of each segment magnet 24 is controlled by a controller 26 including a microprocessor and the like. In an internal memory of the controller 26, an appropriate switching timing, at which the first magnetic field state is switched to the second magnetic field state, in each processing condition is registered in advance. This switching timing is a timing at which a target object to be etched can be made as thin as possible without exposing any part of a lower layer formed below the target object. This switching timing is determined based on experimental results under various etching conditions. When the controller 26 begins an etching process, it measures the processing time period using an internal timer. When the controller 26 determines that it has reached a switching timing, the controller 26 outputs to the switching mechanism 25 an instruction to switch the first flow amount to the second flow amount of current flowing to the coil.

The dipole ring magnet 23 is connected to a rotational mechanism 27 which controls the dipole ring magnet 23 to rotate along its circumferential direction. In the state where the first magnetic field state or the second magnetic field state is formed, the dipole ring magnet 23 rotates by means of the rotational mechanism 27, and a rotational magnetic field uniformly formed in a horizontal direction with respect to the semiconductor device 3 is made.

Explanations will now be made to a magnetron reactive ion etching method employing the magnetron reactive ion etching apparatus 1 having the above-described structure. The controller 26 controls and carries out each of etching processes, as will be explained below.

The gate valve 19 is open in the state where the setting stand 4 is lowered by the ball screw mechanism including the ball screw 7. The semiconductor device 3 is transported onto the setting stand 4 inside the processing container 2 by non-illustrative transportation means. The setting stand 4 is lifted up in the state illustrated in FIG. 1 by the ball screw mechanism having the ball screw 7. A predetermined voltage is applied to the electrode of the electrostatic chuck 10 from the direct current power source 11, and the semiconductor device 3 is adhered to the electrostatic chuck 10 and arranged on the setting stand 4 according to Coulomb's law (process of arranging an object to be processed).

The gate valve 19 is closed, and the processing container 2 is hermetically closed. The pressure inside the processing container 2 is decompressed at a predetermined pressure level (degree of pressure) by the vacuum pump of the exhaust system 18 through the exhaust hole 17 (decompression process). An etching gas is supplied uniformly onto the processing surface of the semiconductor device 3 from the processing gas supply system 16 via the gas supply tube 15, the shower head 13 and the gas exhaust holes 14. Further, the pressure inside the processing container 2 is retained at a predetermined pressure level of, for example, 6 Pa (45 mTorr) (processing gas supplying process).

Once the etching gas is supplied onto the processing surface of the semiconductor device 3, 1500 W of high-frequency electric power, at a frequency of 13.56 Mhz, for example, is supplied from the high-frequency power source 9 to the setting stand 4. Then, the setting stand 4 is self-biased toward negative potentials by the effect of the blocking capacitor 8, resulting in forming an electric field in the direction from the shower head 13 to the setting stand 4 (electric field formation process). Under the effect of this electric field, electrons are discharged from the etching gas, resulting in forming a plasma at the periphery of the surface of the semiconductor device 3 which is arranged on the setting stand 4. Further, thus formed plasma is focused at the periphery of the surface of the semiconductor device 3 by the focus ring 12.

Once the plasma is formed at the periphery of the surface of the semiconductor device 3, the first flow amount of current flowing to each segment magnet 24 is set by the switching mechanism 25. Then, the first flow amount of current flows to each of the segment magnets 24. A uniform magnetic field (the first magnetic field state) is formed totally in one direction in the processing space by the dipole ring magnet 23. At the same time, the dipole ring magnet 23 is controlled to rotate by the rotational mechanism 27, and a rotational magnetic field is uniformly formed in a direction parallel to the semiconductor device (process of forming a magnetic field).

Once a magnetic field is formed in a direction parallel to the semiconductor device, electrons inside the processing space undergo electron motion. Thus the frequency at which the electrons and neutral particles collide with each other is high. By such collision between the electrons and the neutral particles, the etching gas at the periphery of the surface of the semiconductor device 3 is more likely to be ionized. Then, ions are injected into the semiconductor device 3, and the semiconductor device 3 is efficiently etched as a result of both a sputtering effect and a chemical reaction of the ions.

When the etching of the semiconductor device 3 is progressively carried out and when it is the appropriate switching timing for switching the first magnetic field state to the second magnetic field state, the first flow amount of current flowing to each of the segment magnets 24 is switched to the second flow amount by the switching mechanism 25. There is formed the second magnetic field state including a rotational magnetic field, wherein the strength of the magnetic field at the periphery of the surface of the semiconductor device 3 is so satisfactory that the electron Larmor radius is larger than the mean free path of electrons discharged from the etching gas (magnetic field state switching process).

The relationship between the mean free path of electrons and the Larmor radius will now be explained.

Since the Larmor radius is in inverse proportion to the strength of the magnetic field, when the strength of the magnetic field decreases, the Larmor radius increases. When the strength of the magnetic field decreases and the Larmor radius becomes larger than the mean free path of the electrons, such electrons can not satisfactorily move around, resulting in a high percentage of the electrons which are not in cyclotron motion (magnetic field). Hence, the electrons are likely to enter the processing surface (the bottom of the hole formed during the etching process) of the semiconductor device 3. The electrons reach the processing surface of the semiconductor device 3, and a potential difference in the surface of the semiconductor device 3 is unlikely to occur. Therefore, the shading damage, which is likely to occur during an over-etching process and wherein insulating films are deteriorated, can be reduced.

This can fairly be understood from an equation for deriving the diffusion of electrons passing by a magnetic field.

When a magnetic field is formed in a direction perpendicular to the electrons moving along an electric field, the electrons are attracted to the magnetic field and undergo a cyclotron motion. However, if the electrons are not attracted to the magnetic field, while passing by the magnetic filed, and enter (are diffused) the processing surface, the shading damage is unlikely to occur.

The diffusion D of the electrons passing by the magnetic field can be defined from the equation:

$$D=D_o(1+(\lambda m/r)^2)$$

where $D_o$ denotes a diffusion coefficient, $\lambda$ m denotes the mean free path of electrons, and r denotes a Larmor radius. According to this equation, the smaller $\lambda$ m/r, the more the electrons passing by a magnetic field are diffused. Particularly, in the equation, the element $\lambda$ m/r is squared. Thus, if the electron Larmor radius is larger than the mean free path of electrons, the diffusion D so increases as to reach the diffusion coefficient, and the electrons are likely to enter the processing surface without being attracted by the magnetic field.

Even in the second magnetic field state, a little magnetic field exists, some of the electrons in the processing space undergo a cyclotron motion. The electrons collide with the neutral particles, and the ionization of the etching gas at the periphery of the surface of the semiconductor device 3 is realized. Thus, the etching speed does not dramatically decreases.

When the etching process ends, the supplying of the etching gas from the processing gas supply system 16 ends. The setting stand 4 is lowered by the ball screw mechanism having the ball screw 7, and applying of a voltage from the direct-current power source 11 to the electrostatic chuck 10 is cancelled. Finally, the gate valve 19 is open, and the semiconductor device 3 is transported out from the processing container 2 by the non-illustrative transportation means.

Figure 3:
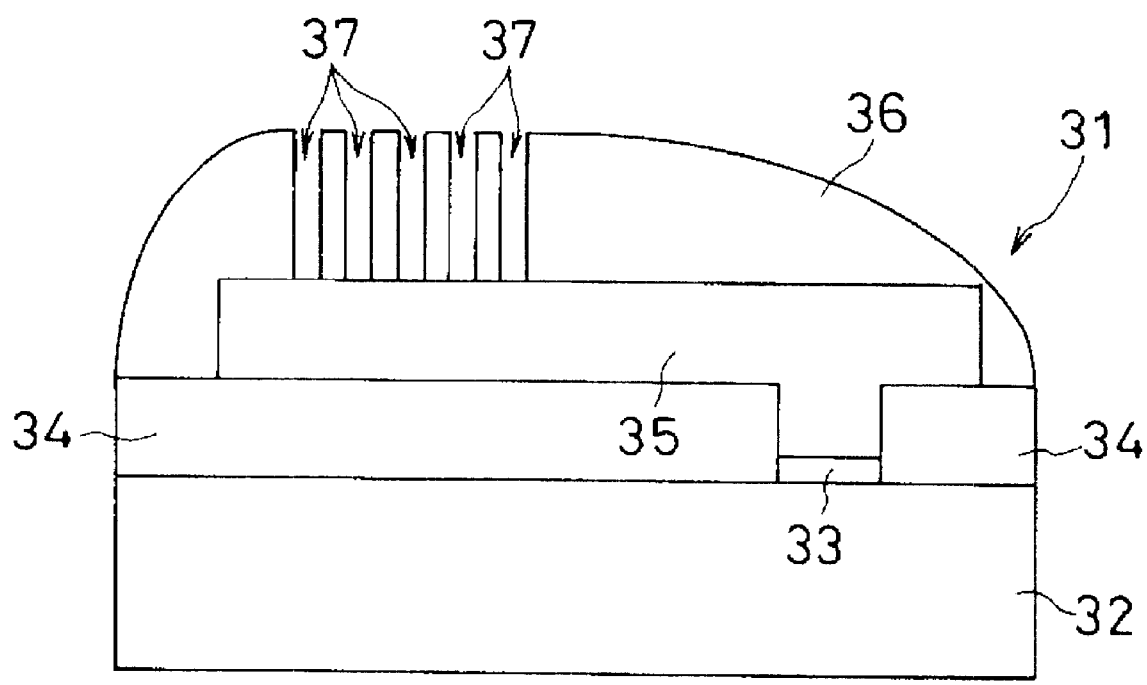
FIG. 3 is an exemplary diagram showing an antenna MOS according to the embodiment.

In order to obtain a reliable result of this embodiment, magnetron reactive ion etching is performed using an antenna MOS shown in FIG. 3. One hundred twelve antenna MOSs are formed on a semiconductor wafer (8 inches), and one of them is exemplarily shown in FIG. 3.

As illustrated in FIG. 3, an antenna MOS 31 comprises a semiconductor wafer 32, a gate oxide film 33, a first insulating film 34, an electrode film 35 and a second insulating film 36. The gate oxide film 33 is arranged on a part of the semiconductor wafer 32, and the first insulating film 34 is formed another part of the semiconductor wafer 32 where the gate oxide film 33 is not arranged. The electrode film 35 is formed on the gate oxide film 33 and the first insulating film 34. The second insulating film 36 covers the electrode film 36. A plurality of holes 37 reaching the electrode film 35 are formed in the second insulating film 36. The antenna MOS 31 having the above structure is etched. In doing this, it is measurable whether the gate oxide film 33 damaged or not.

Figure 4:
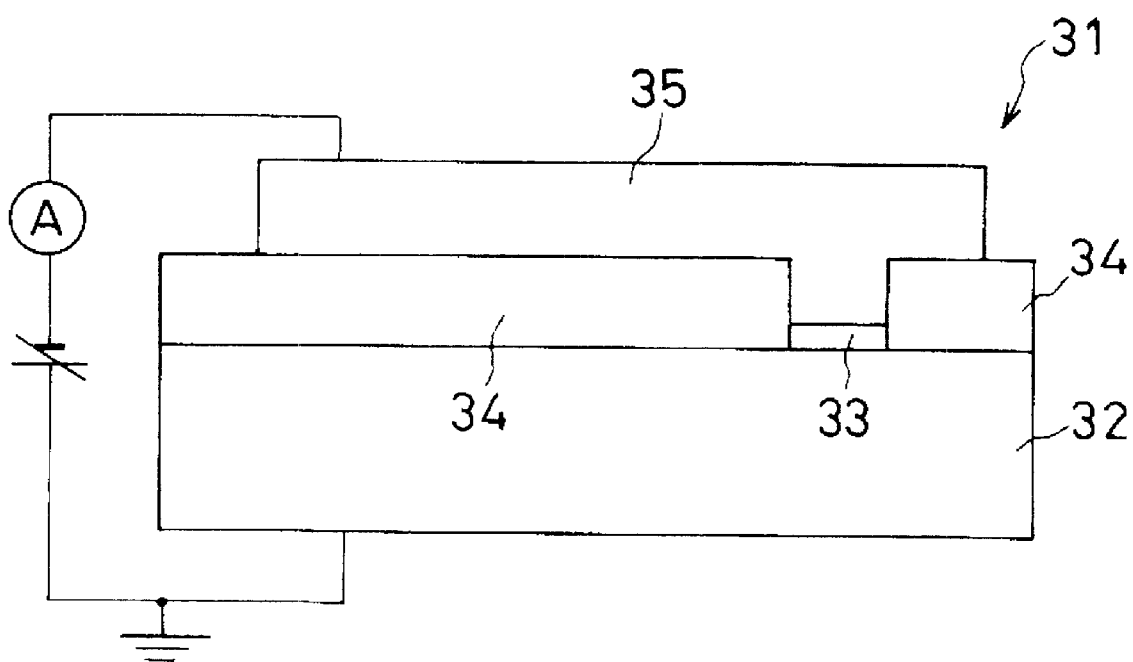
FIG. 4 is an exemplary diagram showing a state where to measure the shading damage occurring in the antenna MOS according to the embodiment.

As illustrated in FIG. 4, this measurement of whether a current is supplied to the gate oxide film 33 is performed for the entire one hundred twelve antenna MOSs on the semiconductor wafer 32. As a result of this measurement, the number of antenna MOSs 31 whose gate oxide film 33 is damaged is only 5. For the sake of comparison, measurement is similarly performed for antenna MOSs which are etched (etched only in the first magnetic field state) using the conventional magnetron reactive ion etching apparatus. According to this measurement, the number of MOSs whose gate oxide film is damaged is 55. Accordingly, if the etching process is performed using the magnetron reactive ion etching apparatus 1 according to this embodiment, the damage of the gate oxide film 33 can only occur less than one tenth of the conventional case. It is also confirmed that the shading damage can be reduced, according to the measurement.

As explained above, according to this embodiment, the etching process is performed while switching the first and second magnetic field states from one to another at an appropriate timing. Therefore, the shading damage which is likely to occur during an over-etching process can be reduced, and at the same time, an etching process can efficiently be carried out.

Figure 5A:
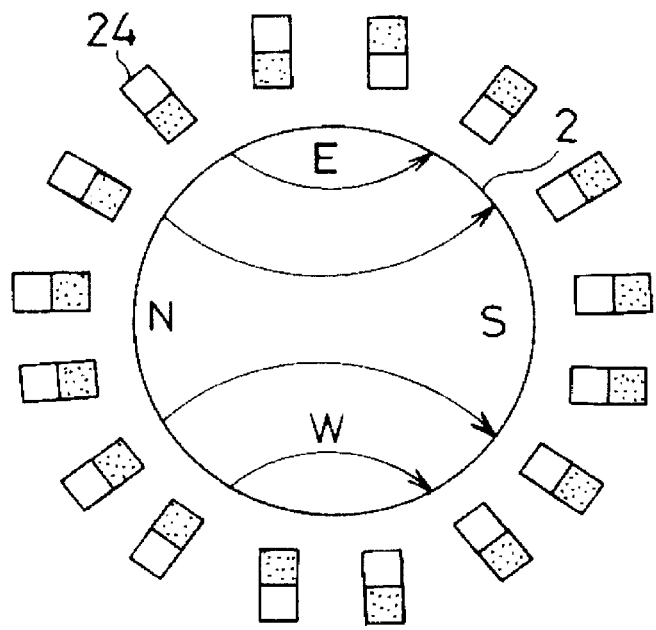
FIG. 5A is an exemplary diagram showing a dipole ring magnet, in the first magnetic field state, according to another embodiment of the present invention.

The present invention is not limited to the above embodiments. A permanent magnet can be employed in place of the segment magnet 24, for example. As illustrated in FIG. 5A, the magnetic poles of the segment magnets 24 are in the dipole arrangement so as to form the first magnetic field state, and also the arrangement of the magnetic poles of the segment magnets 24 is changed so as to form the second magnetic field state. In such a case, a sufficiently large magnetic field can be formed in the first magnetic field state, and an efficient process can further be performed.

Figure 5B:
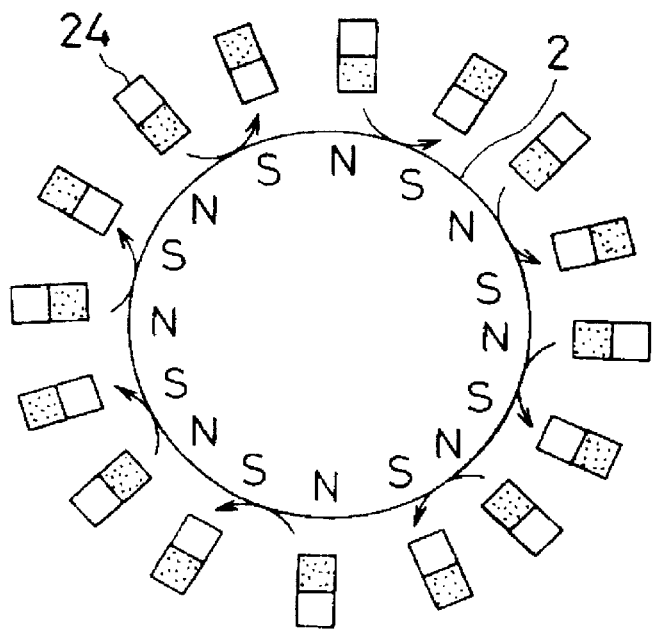
FIG. 5B is an exemplary diagram showing the dipole ring magnet, in the second magnetic field state, according to the another embodiment of the present invention.

In the second magnetic field state, there may be formed a magnetic field whose strength at the periphery of the surface of a target object to be processed is so satisfactory that the electron Larmor radius is larger than the mean free path of the electrons, or there may be formed a substantially non-magnetic field. In this case, as illustrated in FIG. 5B, if the magnetic poles of the segment magnets 24 are in the multi-pole arrangement, the second magnetic field state can be formed.

Figure 6A:
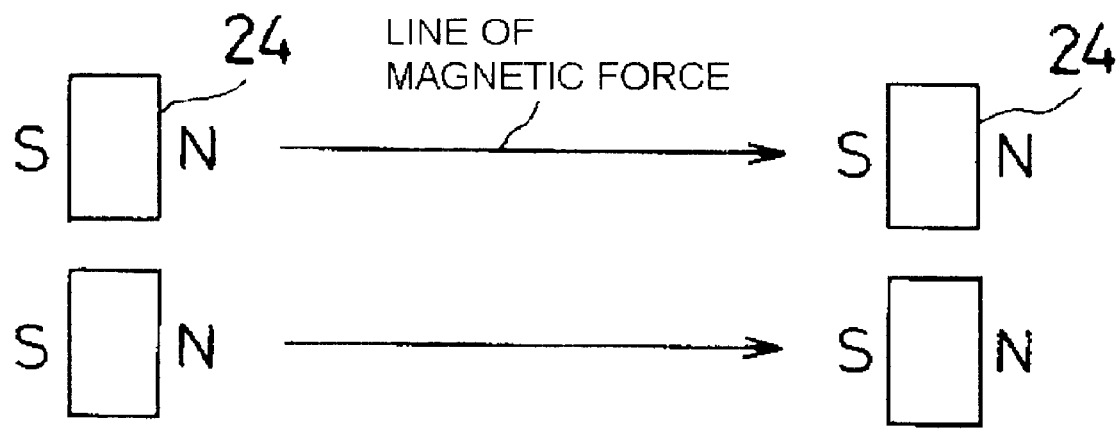
FIG. 6A is an exemplary diagram showing a dipole ring magnet, in the first magnetic field state, according to still another embodiment of the present invention.
Figure 6B:
FIG. 6B is an exemplary diagram showing the dipole ring magnet, in the second magnetic field state, according to the still another embodiment of the present invention.

As shown in FIGS. 6A and 6B, a dipole ring magnet 23 is formed at the periphery of the upper part 2a of the processing container 2, and includes two layers of segment magnets 24 one on top of the other. For easy description, FIGS. 6A and 6B each exemplarily depicts a side view of two pairs of segment magnets 24 of the dipole ring magnet 23. In this case, the arrangement of the magnetic poles of the lower segment magnets 24 is changed from the first magnetic field state of the dipole arrangement as shown in FIG. 6A. By doing so, the second magnetic field state of a non-magnetic field, wherein a line of magnetic force is directed from the upper to lower magnetic segments, can be formed as illustrated in FIG. 6B.

Figure 7A:
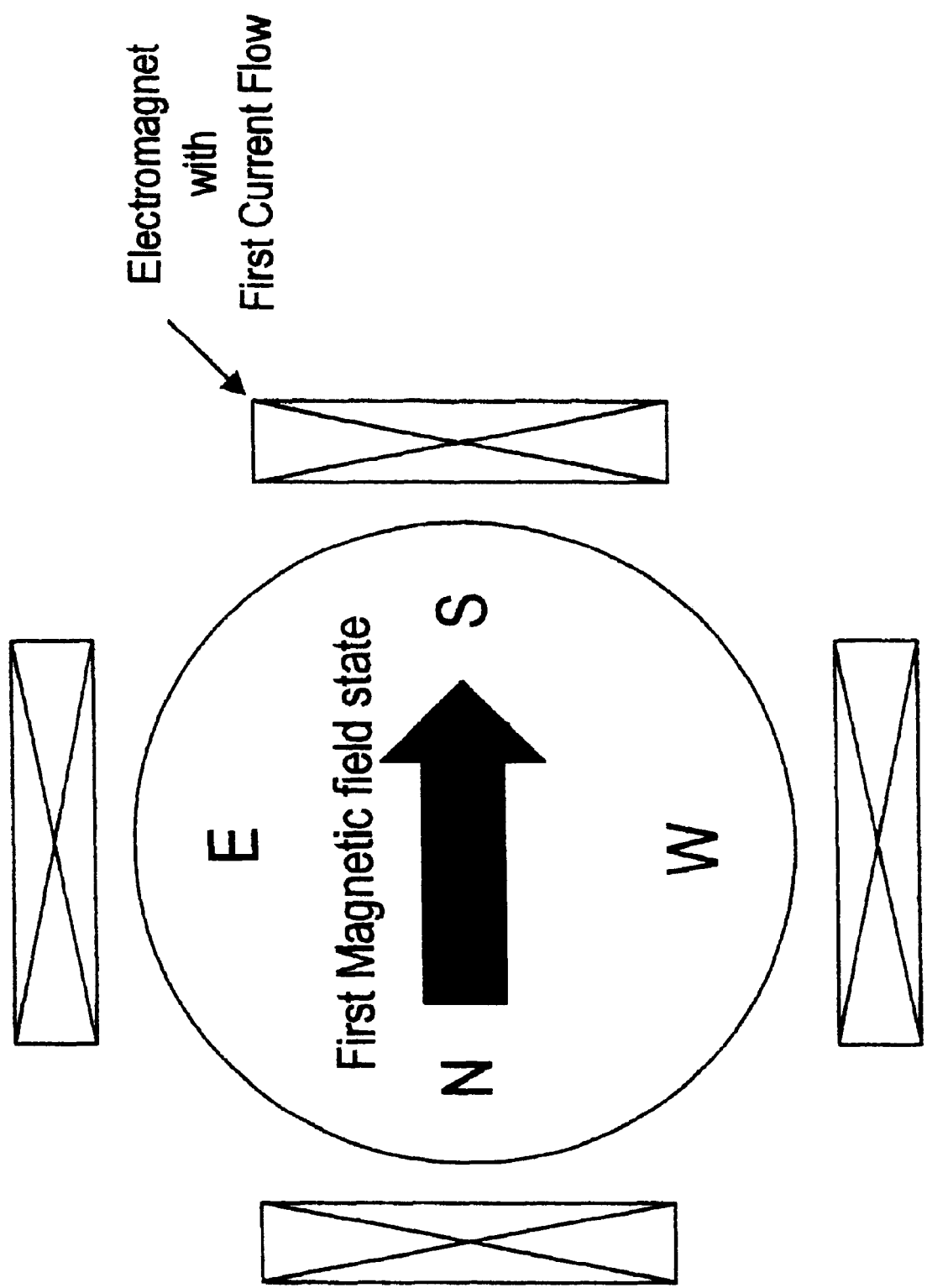
FIG. 7A is an exemplary diagram showing an electromagnet, in the first magnetic field state, according to still yet another embodiment of the present invention.
Figure 7B:
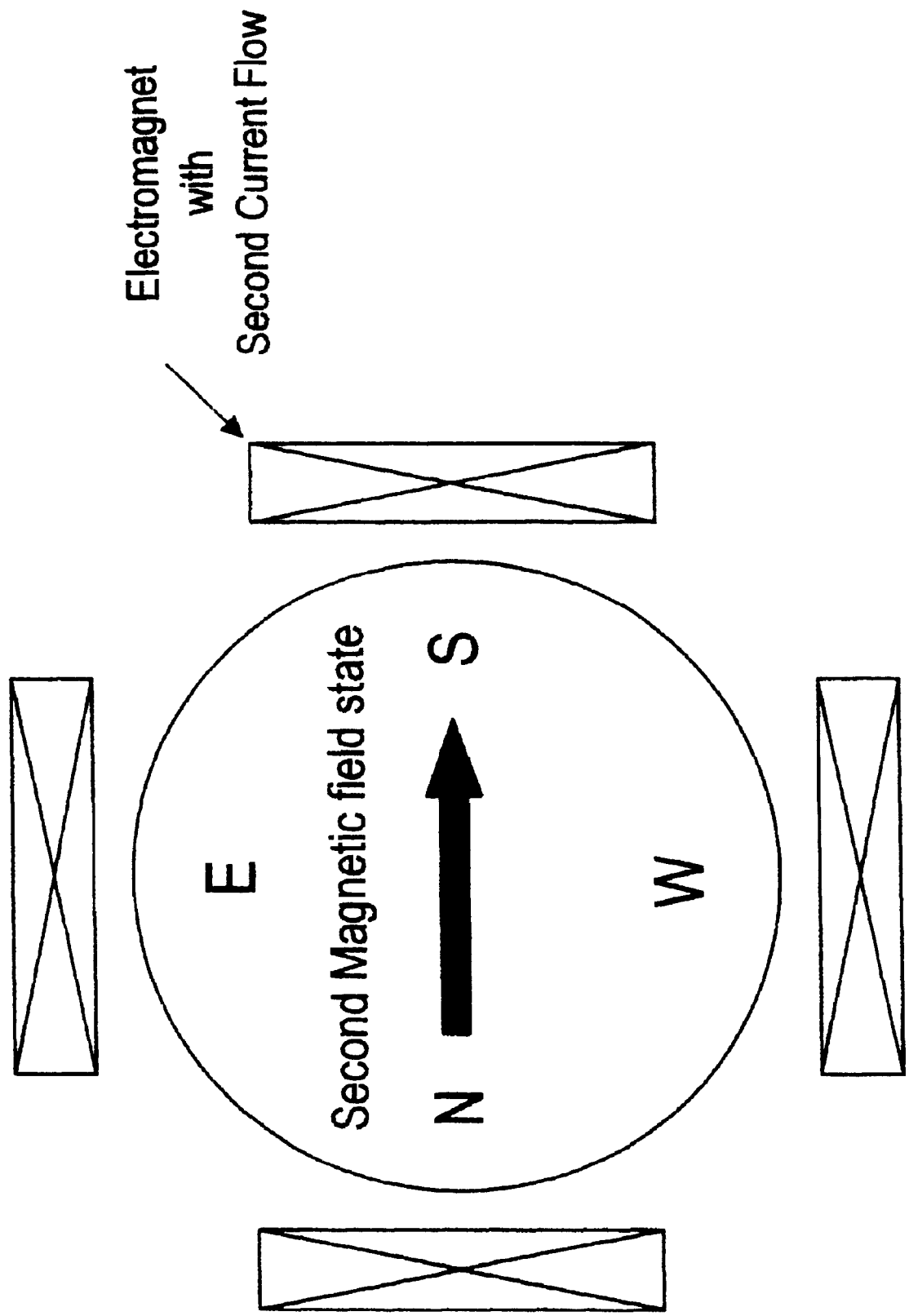
FIG. 7B is an exemplary diagram showing an electromagnet, in the second magnetic field state, according to the still yet another embodiment.
Figure 8A:
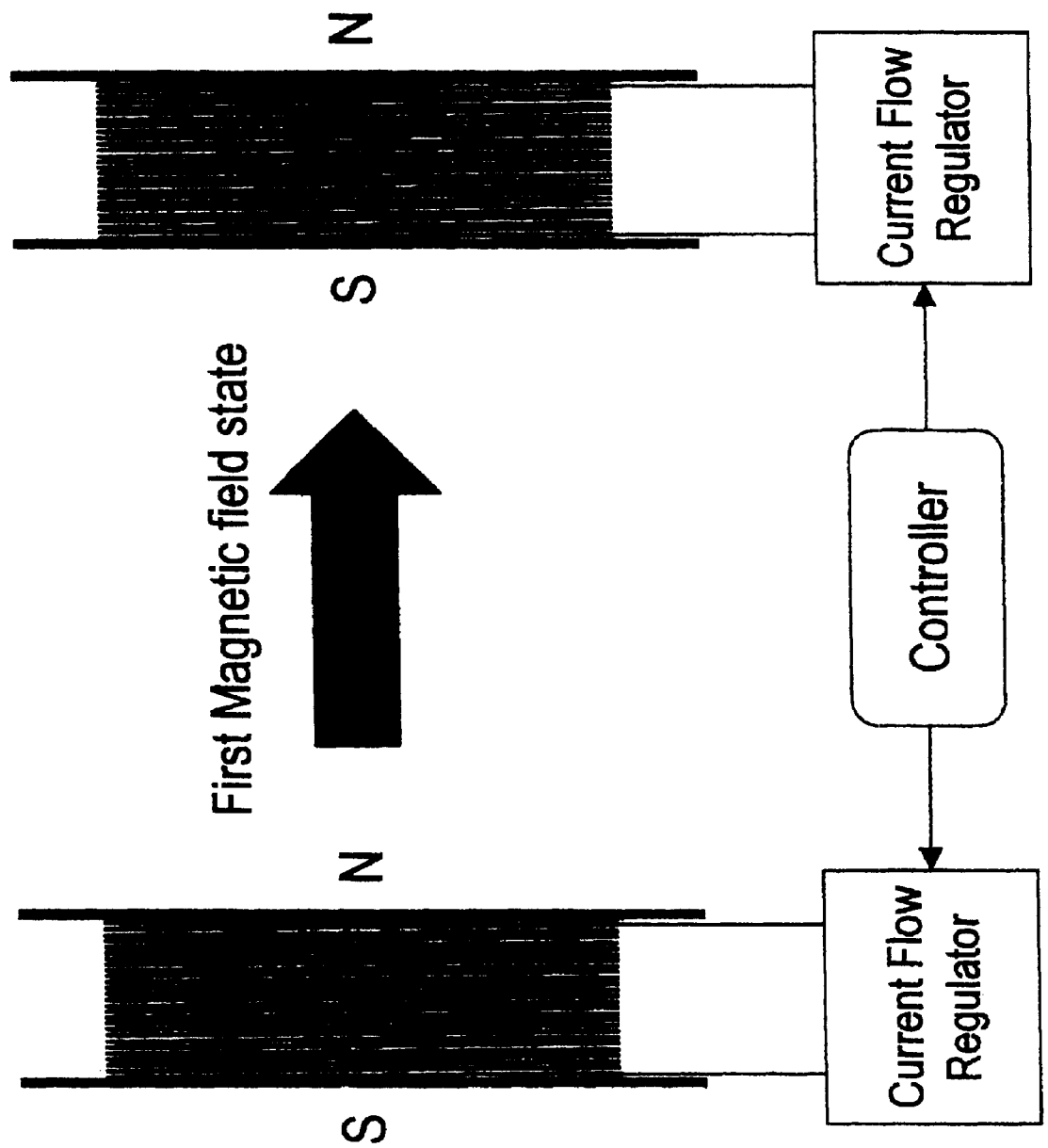
FIG. 8A is a cross sectional view of the electromagnet shown in FIG. 7A.
Figure 8B:
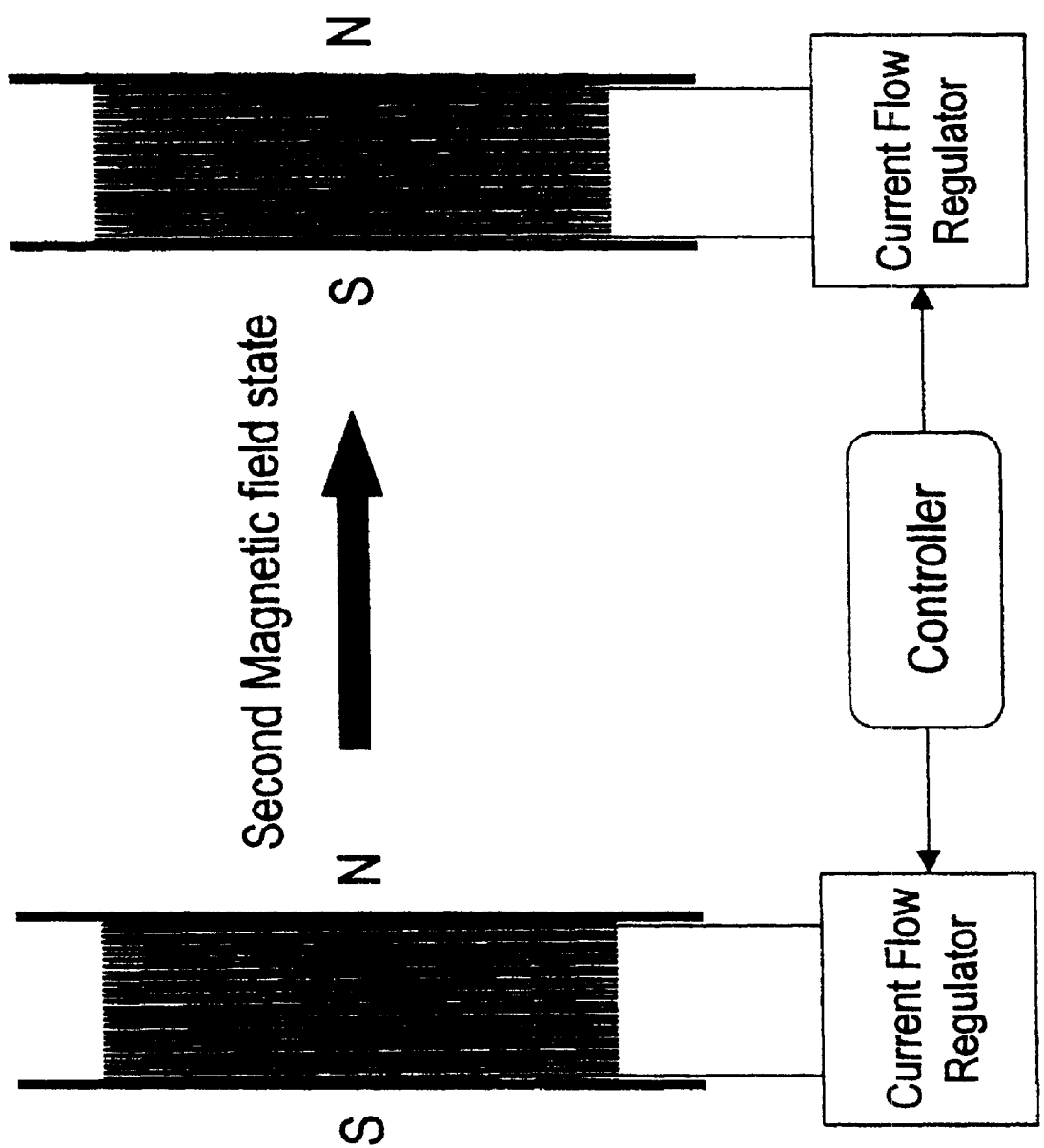
FIG. 8B is a cross sectional view of the electromagnet shown in FIG. 7B.

In this embodiment, the explanations have been made to the case where the sixteen electromagnets are formed in a ring-like form. However, the present invention is not limited to the above. For example, as illustrated in FIGS. 7A and 7B, a smaller number of electromagnets may be prepared. In a case where the first flow amount of current which is controlled by the controller illustrated in FIG. 8A flows to the electromagnets, a magnetic field totally in one direction is formed in the processing space, as shown in FIG. 7A. In a case where the electromagnets are controlled to rotate through the rotational mechanism 27, thereby to form the first magnetic field state. In a case where the second flow amount of current which is controlled by the controller illustrated in FIG. 8B flows to the electromagnets, the second magnetic field state whose magnetic strength is smaller than that of the first magnetic field state is formed, as shown in FIG. 7B.

Figure 9A:
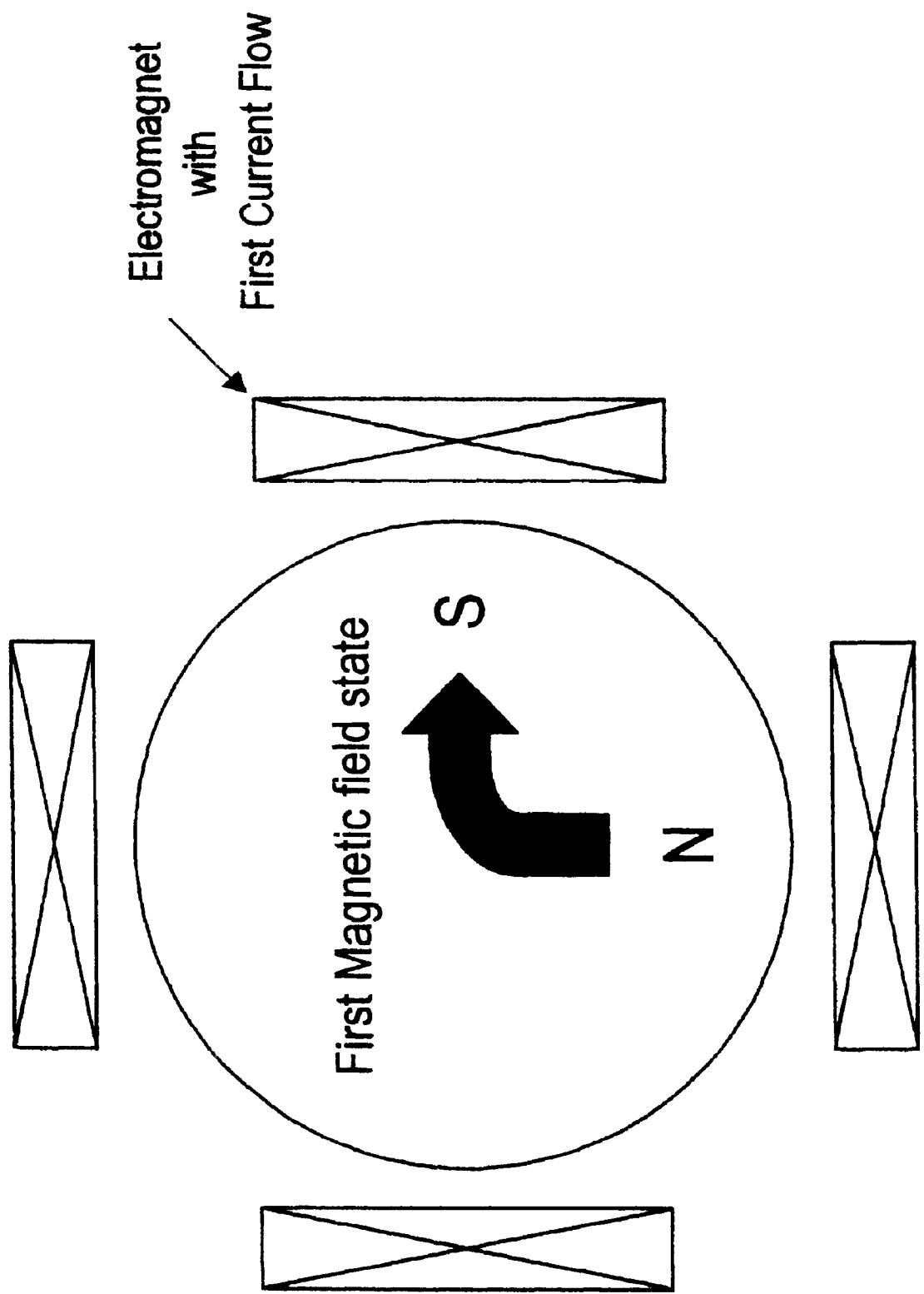
FIG. 9A is an exemplary diagram showing an electromagnet, in the first magnetic field state, according to further embodiment of the present invention.
Figure 9B:
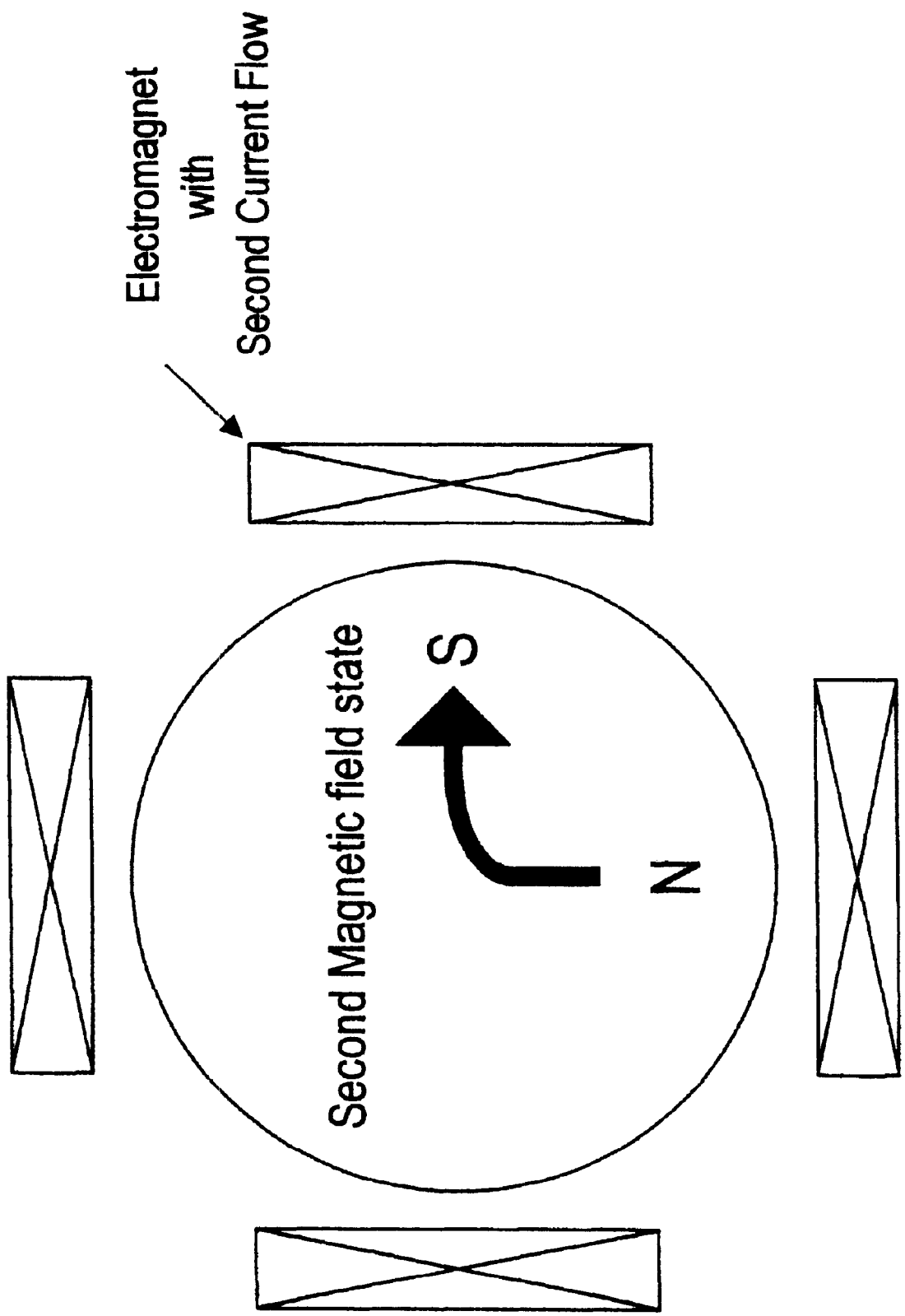
FIG. 9B is an exemplary diagram showing an electromagnet, in the second magnetic field state, according to the further embodiment.
Figure 10:
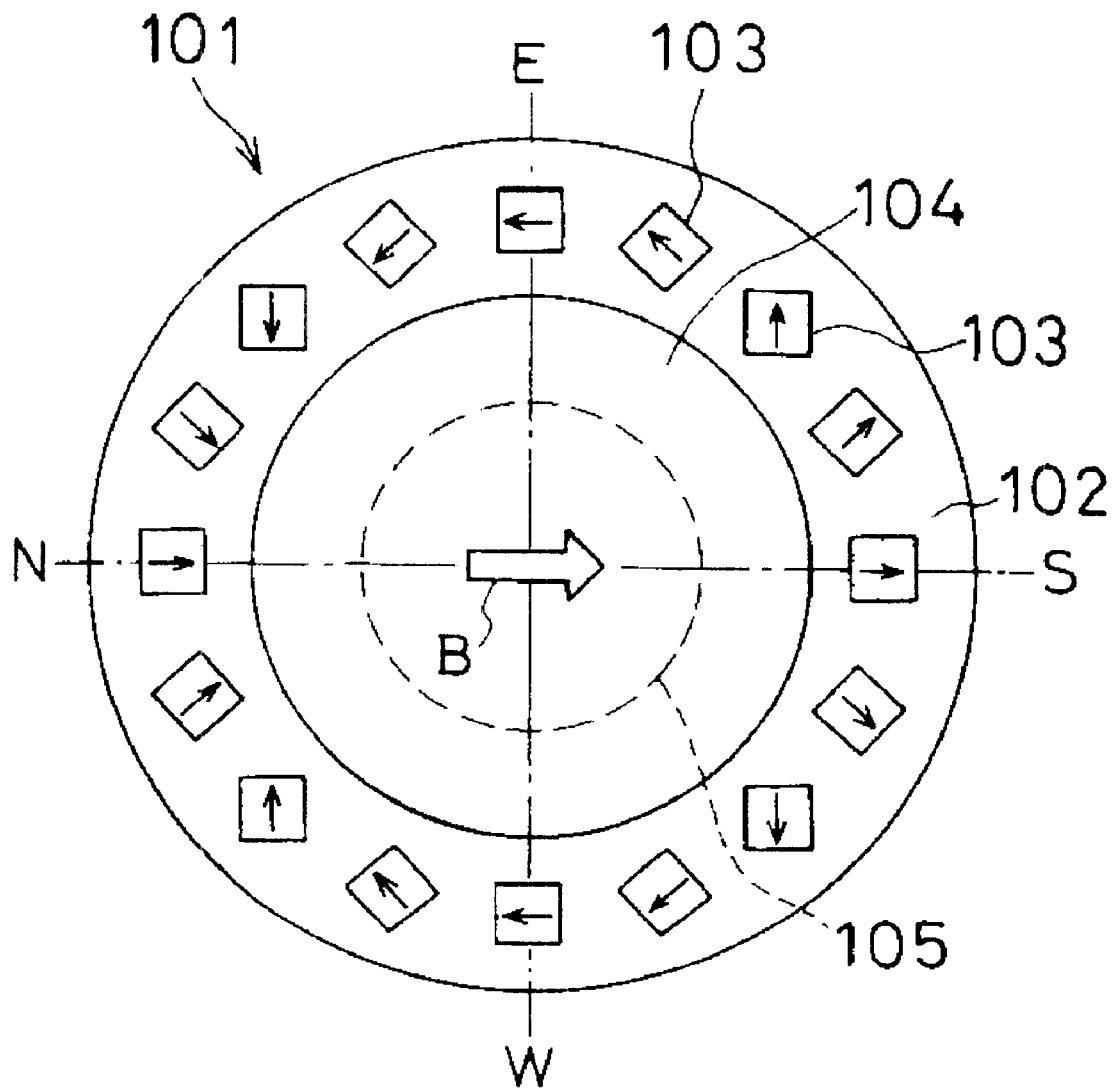
FIG. 10 is an exemplary diagram showing a conventional dipole ring magnet.
Figure 11:
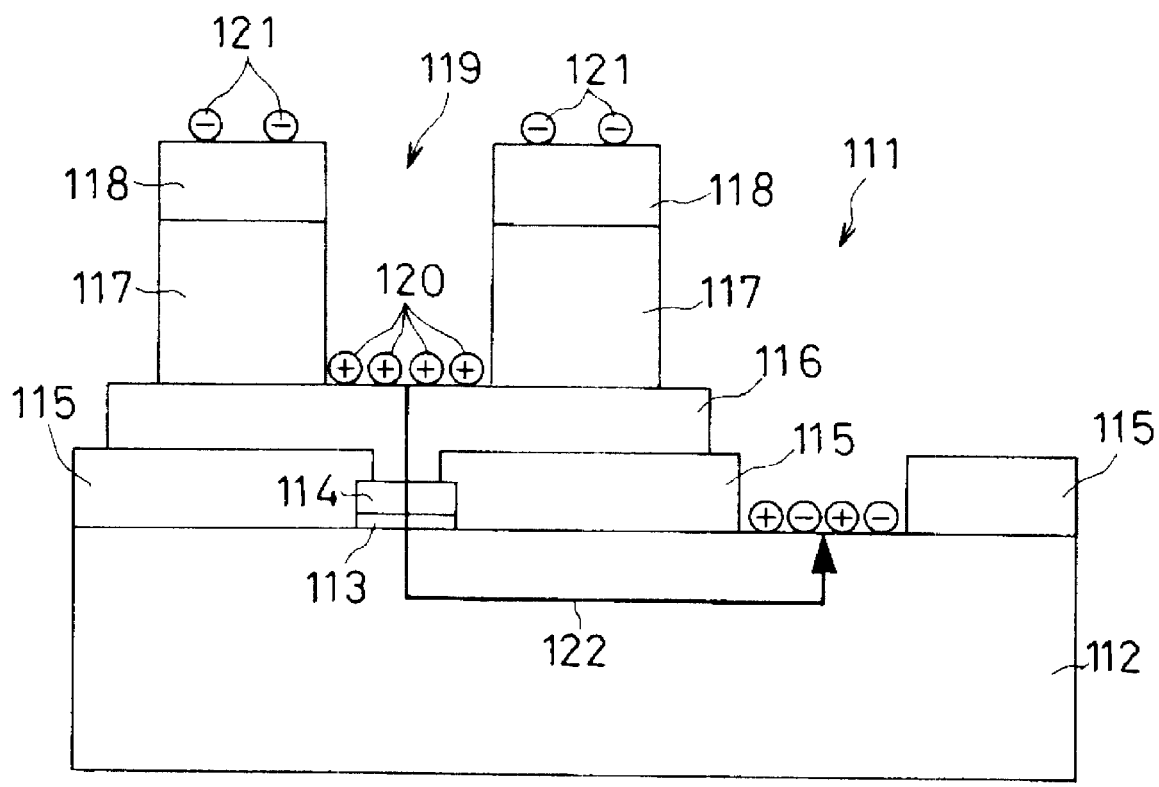
FIG. 11 is an exemplary diagram for explaining the shading damage.

The line of magnetic force formed in the processing space is not necessarily in the form of a straight line in the diametral direction of the processing space. For example, as illustrated in FIGS. 9A and 9B, the line of the magnetic force may be in the form of an arc line. In this case, it is preferred that the diameter of the line of the magnetic force in the form of an arc line is a range around the Larmor radius of the magnetic field.

An electromagnetic wave shield, which can appear between the processing container 2 and the dipole ring magnet 23, may be arranged. In this case, the electromagnetic wave shield between the processing container 2 and the dipole ring magnet 23 is retrieved so as to form the first magnetic field state, and the electromagnetic wave shield is inserted therebetween so as to form the second magnetic field state.

In this embodiment, explanations have been made to the magnetron reactive ion etching apparatus. However, the present invention is not limited to the above, and can be employed for, for example, a magnetron reactive ion CVD apparatus, a magnetron reactive ion sputtering apparatus, a magnetron plasma etching apparatus, a magnetron plasma CVD apparatus, a magnetron plasma sputtering apparatus, and the like.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. H11-253734 filed on Sep. 8, 1999, and including specification, claims, drawings and summary. The disclosure of the above Japanese Patent Application is incorporated herein by reference in its entirety.

What is claimed is:

1. The processing apparatus comprising:

a processing container;

an electrode unit which is arranged inside said processing container and includes a first electrode and a second electrode facing each other via an object to be processed;

a processing gas supply section which supplies a processing gas into said processing container;

a gas exhaust section which exhausts said processing container of a gas;

an electric field formation section which supplies high-frequency electric power to said electrode unit and forms an electric field between the first electrode and the second electrode;

a magnetic field formation section which forms a first magnetic field state, including a magnetic field in said electrode unit in a direction perpendicular to the direction of the electric field or in a direction parallel to the object, and a second magnetic field state, including a magnetic field whose magnetic field strength at a periphery of a surface of the object is so satisfactory that an electron Larmor radius is larger than a mean free path of electrons; and a magnetic field state switching section which switches a magnetic field state from/to the first magnetic field state to/from the second magnetic field state, said magnetic field state switching section including a switch control mechanism which switches the first magnetic field state to the second magnetic field state at a predetermined timing.

2. The processing apparatus according to claim 1, wherein the second magnetic field includes a magnetic field in a direction perpendicular to the direction of the electric field or in a direction parallel to the object.

3. The processing apparatus according to claim 1, wherein the processing gas includes a gas having reactive ion species and used for performing magnetron reactive ion processing for the object.

4. The processing apparatus according to claim 1, wherein a magnetic field is uniformly formed on the object in the first magnetic field state and in the second magnetic field state.

5. The processing apparatus according to claim 1, wherein:

said magnetic field formation section includes a plurality of electromagnets which are so arranged that said electrode unit is sandwiched therebetween, and said magnetic field state switching section is capable of switching a flow amount of current flowing to the electromagnets from/to a first flow amount to/from a second flow amount; and the first flow amount of current flows to the electromagnets so as to form the first magnetic field state, and the second flow amount of current flows to the electromagnets so as to form the second magnetic field state.

6. The processing apparatus according to claim 2, wherein:

said magnetic field formation section includes a plurality of electromagnets which are so arranged that the electrode unit is sandwiched therebetween, and said magnetic field state switching section is capable of switching a flow amount of current flowing to the electromagnets from/to a first flow amount to/from a second flow amount;

the first flow amount of current flows to the electromagnets so as to form the first magnetic field state, and the second flow amount of current flows to the electrodes so as to form the second magnetic field state.

7. The processing apparatus according to claim 3, wherein:

said magnetic field formation section includes a plurality of electromagnets which are so arranged that the electrode unit is sandwiched therebetween, and said magnetic field state switching section is capable of switching a flow amount of current flowing to the electromagnets from/to a first flow amount to/from a second flow amount;

the first flow amount of current flows to the electromagnets so as to form the first magnetic field state, and the second flow amount of current flows to the electrodes so as to form the second magnetic field state.

8. The processing apparatus according to claim 4, wherein:

said magnetic field formation section includes a plurality of electromagnets which are so arranged that the electrode unit is sandwiched therebetween, and said magnetic field state switching section is capable of switching a flow amount of current flowing to the electromagnets from/to a first flow amount to/from a second flow amount;

the first flow amount of current flows to the electromagnets so as to form the first magnetic field state, and the second flow amount of current flows to the electrodes so as to form the second magnetic field state.

9. The processing apparatus according to claim 1, wherein said magnetic field formation section includes a plurality of permanent magnets which are so arranged that the electrode unit is sandwiched therebetween, and said magnetic field state switching section forms the first magnetic field state by arranging the plurality of permanent magnets in dipole arrangement and also the second magnetic field state by changing directions of magnetic poles of the plurality of permanent magnets.

10. The processing apparatus according to claim 2, wherein said magnetic field formation section includes a plurality of permanent magnets which are so arranged that the electrode unit is sandwiched therebetween, and said magnetic field state switching section forms the first magnetic field state by arranging the plurality of permanent magnets in dipole arrangement and also the second magnetic field state by changing directions of magnetic poles of the plurality of permanent magnets.

* * * * *